(12) United States Patent
Huang

(10) Patent No.: US 7,982,534 B2
(45) Date of Patent: Jul. 19, 2011

(54) CHARGE DOMAIN FILTER

(75) Inventor: Ming-Feng Huang, Jhubei (TW)

(73) Assignee: Industrial Technology Research Institute, Chutung (TW)

( * ) Notice: Subject to any disclaimer, the term of this patent is extended or adjusted under 35 U.S.C. 154(b) by 0 days.

(21) Appl. No.: 12/702,834

(22) Filed: Feb. 9, 2010

(65) Prior Publication Data

US 2011/0121893 A1    May 26, 2011

(30) Foreign Application Priority Data

Nov. 20, 2009   (TW) ................................ 98139457 A

(51) Int. Cl.
 *H03K 5/00*   (2006.01)
(52) U.S. Cl. ...................................................... 327/554
(58) Field of Classification Search .......... 327/551–559, 327/336–337, 94; 330/9
See application file for complete search history.

(56) References Cited

U.S. PATENT DOCUMENTS

| | | | |
|---|---|---|---|
| 6,963,732 B2 | 11/2005 | Muhammad et al. | |
| 7,006,813 B2 | 2/2006 | Staszewski et al. | |
| 7,079,826 B2 | 7/2006 | Muhammad et al. | |
| 7,535,288 B2 * | 5/2009 | Iida | 327/554 |
| 7,636,012 B2 * | 12/2009 | Iida | 327/554 |

OTHER PUBLICATIONS

Darius Jakonis , et al., A 2.4-GHz RF Sampling Receiver Front-End in 0.18-_m CMOS, IEEE Journal of Solid-State Circuits, Jun. 2005, Vol. 40, No. 6, . pp. 1265-1277.

* cited by examiner

*Primary Examiner* — Dinh T. Le
(74) *Attorney, Agent, or Firm* — Wang Law Firm, Inc.; Li K. Wang

(57) ABSTRACT

A charge domain filter having a phase divider, first switched capacitor networks, second switched capacitor networks and a connecting circuit. The phase divider receives a first and a second input signal to output first phase divided signals based on the first input signal and second phase divided signals based on the second input signal. The first switched capacitor networks, holding a one to one relationship with the first phase divided signals, each has an input terminal receiving the corresponding first phase divided signal and has an output terminal. The second switched capacitor networks, holding a one to one relationship with the second phase divided signals, each has an input terminal receiving the corresponding second phase divided signal and has an output terminal. The connecting circuit determines connections between the output terminals of the first and second switched capacitor networks to generate a plurality of output signals.

15 Claims, 13 Drawing Sheets

US 7,982,534 B2

CHARGE DOMAIN FILTER

CROSS REFERENCE TO RELATED APPLICATIONS

This application claims priority of Taiwan Patent Application No. 98139457, filed on Nov. 20, 2009 the entirety of which is incorporated by reference herein.

BACKGROUND OF THE INVENTION

1. Technical Field

The present invention relates to charge domain filters.

2. Background

A switched-capacitor network, including a plurality of switches and capacitors, is a common circuit in discrete time signal processing. By controlling the states of the switches, the user can control the electrons stored in the capacitors and thereby perform signal processing on the input signal of the switched-capacitor network.

The switched-capacitor network is usually applied to signal filtering. In comparison with analog filters of capacitors and resistors, the switched-capacitor network filters the input signal according to the size ratio of the capacitors thereof. Because accurate capacitors and resistors are not required, it is applicable to manufacture the switched-capacitor networks in chips.

SUMMARY

The specification discloses charge domain filters.

An exemplary embodiment of the charge domain filter comprises a phase divider, a plurality of first switched capacitor networks, a plurality of second switched capacitor networks and a connecting circuit. The phase divider receives a first input signal and a second input signal to generate a plurality of first phase divided signals based on the first input signal and a plurality of second phase divided signals based on the second input signal. The first switched capacitor networks and the first phase divided signals hold a one to one relationship. Each of the first switched capacitor networks has an input terminal receiving the corresponding first phase divided signal and has an output terminal. The second switched capacitor networks and the second phase divided signals have a one to one relationship. Each of the second switched capacitor networks has an input terminal receiving the corresponding second phase divided signal and has an output terminal. The connecting circuit determines the connections between the output terminals of the first and second switched capacitor networks to form output terminals of the charge domain filter.

The specification further discloses a filter device using the disclosed charge domain filters. An exemplary embodiment of the filter device comprises a plurality of charge domain filters which are cascaded in a series. Each of the charge domain filters comprises: a phase divider, a plurality of first switched capacitor networks, a plurality of second switched capacitor networks and a connecting circuit. In one of the charge domain filters, the phase divider receives a first input signal and a second input signal to generate a plurality of first phase divided signals based on the first input signal and to generate a plurality of second phase divided signals based on the second input signal. The first switched capacitor networks and the first phase divided signals hold a one to one relationship: each of the first switched capacitor networks has an input terminal receiving the corresponding first phase divided signal and has an output terminal. The second switched capacitor networks and the second phase divided signals hold a one to one relationship: each of the second switched capacitor networks has an input terminal receiving the corresponding second phase divided signal and has an output terminal. The connecting circuit determines the connection between the output terminals of the first and second switched capacitor networks and thereby generates at least two output signals to be input to the circuit in the next stage.

The charge domain filter further involves time-interleaving techniques. In such a case, the charge domain filter comprises a phase divider, groups of first switched capacitor networks, groups of second switched capacitor networks, and a connecting circuit. The phase divider receives a first input signal and a second input signal to generate a plurality of first phase divided signals based on the first input signal and to generate a plurality of second phase divided signals based on the second input signal. The first switched capacitor network groups hold a one to one relationship with the first phase divided signals. The first switched capacitor networks of the same group each have an input terminal receiving the same first phase divided signal and have an output terminal. The second switched capacitor network groups hold a one to one relationship with the second phase divided signals. The second switched capacitor networks of the same group each have an input terminal receiving the same second phase divided signal and have an output terminal.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 4A depicts the frequency response of a charge domain filter, wherein a narrow band IIR technique is applied to;

FIG. 4B depicts the frequency response of a charge domain filter, wherein a wide band FIR technique is applied to;

DETAILED DESCRIPTION

The following description shows several embodiments carrying out the invention. This description is made for the purpose of illustrating the general principles of the invention and should not be taken in a limiting sense. The scope of the invention is best determined by reference to the appended claims.

Figure 1:
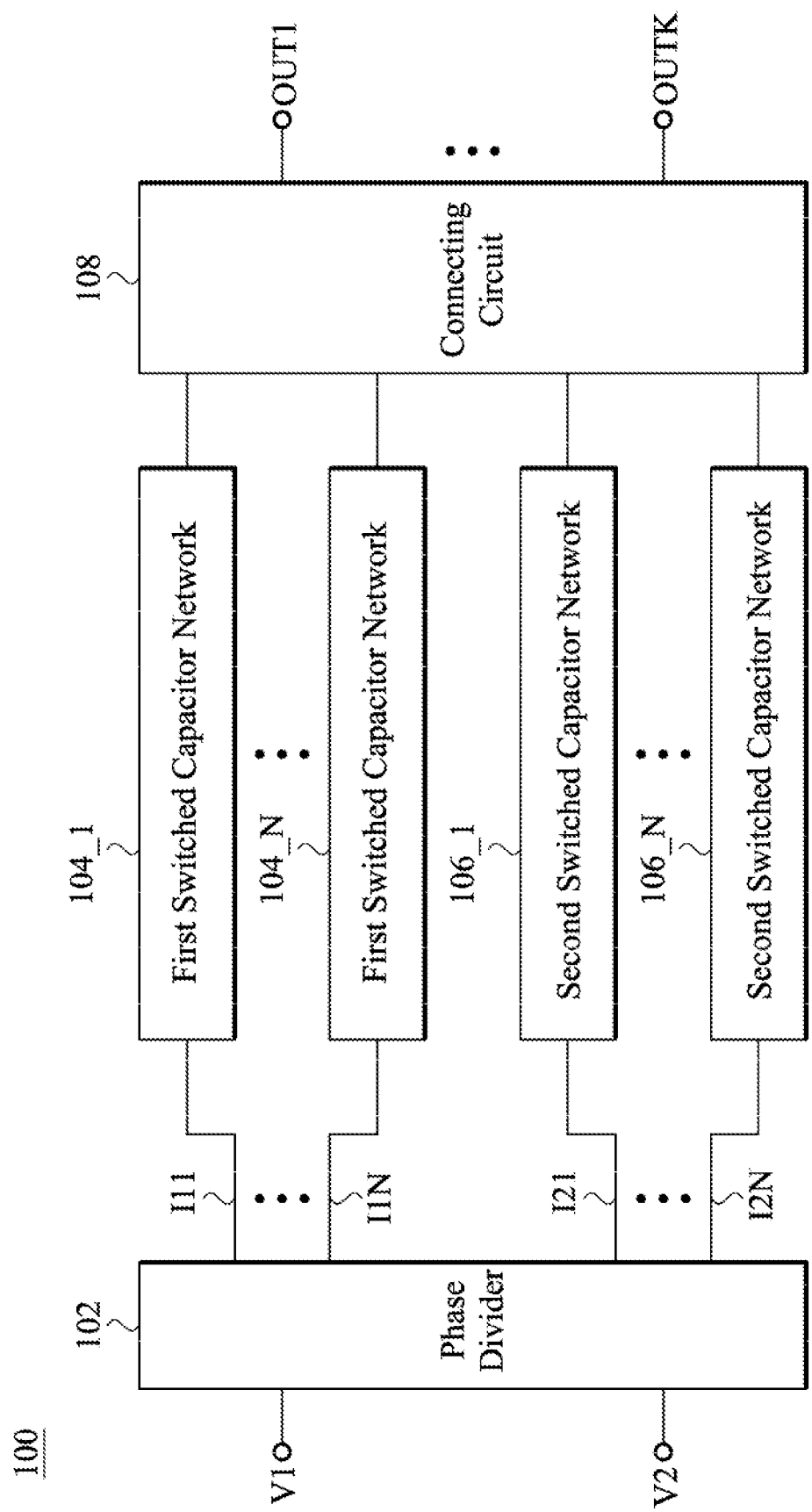
FIG. 1 depicts an exemplary embodiment of a charge domain filter.

FIG. 1 depicts an exemplary embodiment of a charge domain filter 100, which comprises a phase divider 102, a plurality of first switched capacitor networks 104_1 ... 104_N, a plurality of second switched capacitor networks 106_1 ... 106_N and a connecting circuit 108. The phase divider 102 receives a first input signal V1 and a second input signal V2 to generate a plurality of first phase divided signals I11 ... I1N based on the first input signal V1 and to generate a plurality of second phase divided signals I21 ... I2N based on the second input signal V2. The first switched capacitor networks 104_1 ... 104_N hold a one to one relationship with the first phase divided signals I11 ... I1N, and each of those has an input terminal receiving the corresponding first phase divided signal and has an output terminal. The second switched capacitor network 106_1 ... 106_N hold a one to one relationship with the second phase divided signals I21 ... I2N, and each of those has an input terminal receiving the corresponding second phase divided signal and has an output terminal. The connecting circuit 108 determines connections between the output terminals of the first and second switched capacitor networks 104_1 ... 104_N and 106_1 ... 106_N and thereby generates output signals OUT1 ... OUTK.

An exemplary embodiment of the phase divider 102 involves at least one transconductance device. The first and second input signals V1 and V2 are voltage signals while the first phase divided signals I11 ... I1N and the second phase divided signals I21 ... I2N are current signals. Alternatively, the phase divider 102 may be realized by mixers or any circuit capable of phase dividing.

By the connecting circuit 108, there are various ways to connect the output terminals of the first and second switched capacitor networks 104_1 ... 104_N and 106_1 ... 106_N. The connecting circuit 108 may include any electronic components, circuits or traces, to indirectly or directly connect the output terminals of the first and second switched capacitor networks 104_1 ... 104_N and 106_1 ... 106_N. Different connections may results in different signal filter effects.

The first and second switched capacitor networks 104_1 ... 104_N and 106_1 ... 106_N each may be realized by any single-in-single-output switched capacitor network and are allowed to be implemented by different types of switched capacitor networks. The various switched capacitor network structures result in various signal filter effects.

Figure 2A:
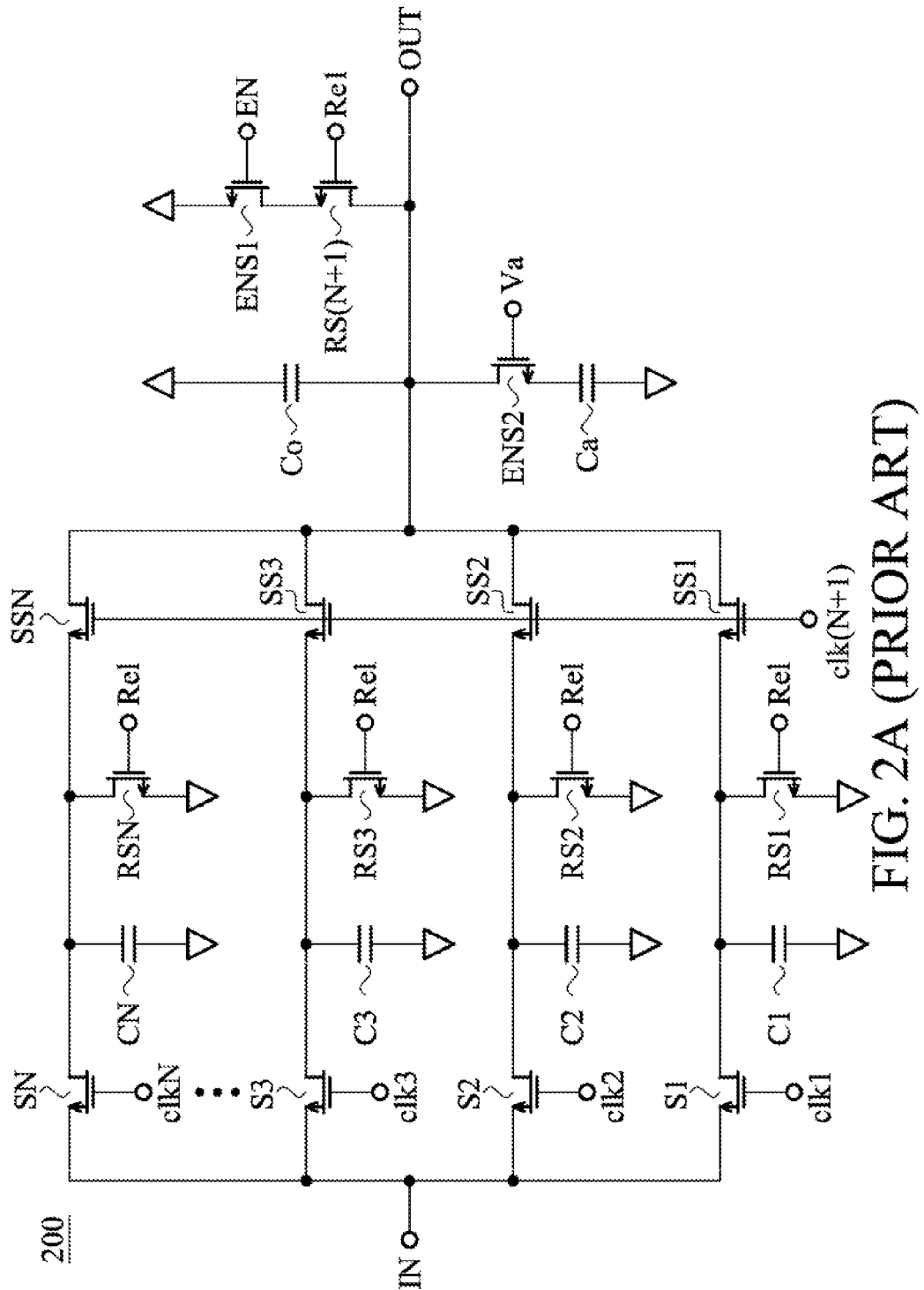
FIG. 2A depicts one of the single-in-single-out switched capacitor networks.
Figure 2B:
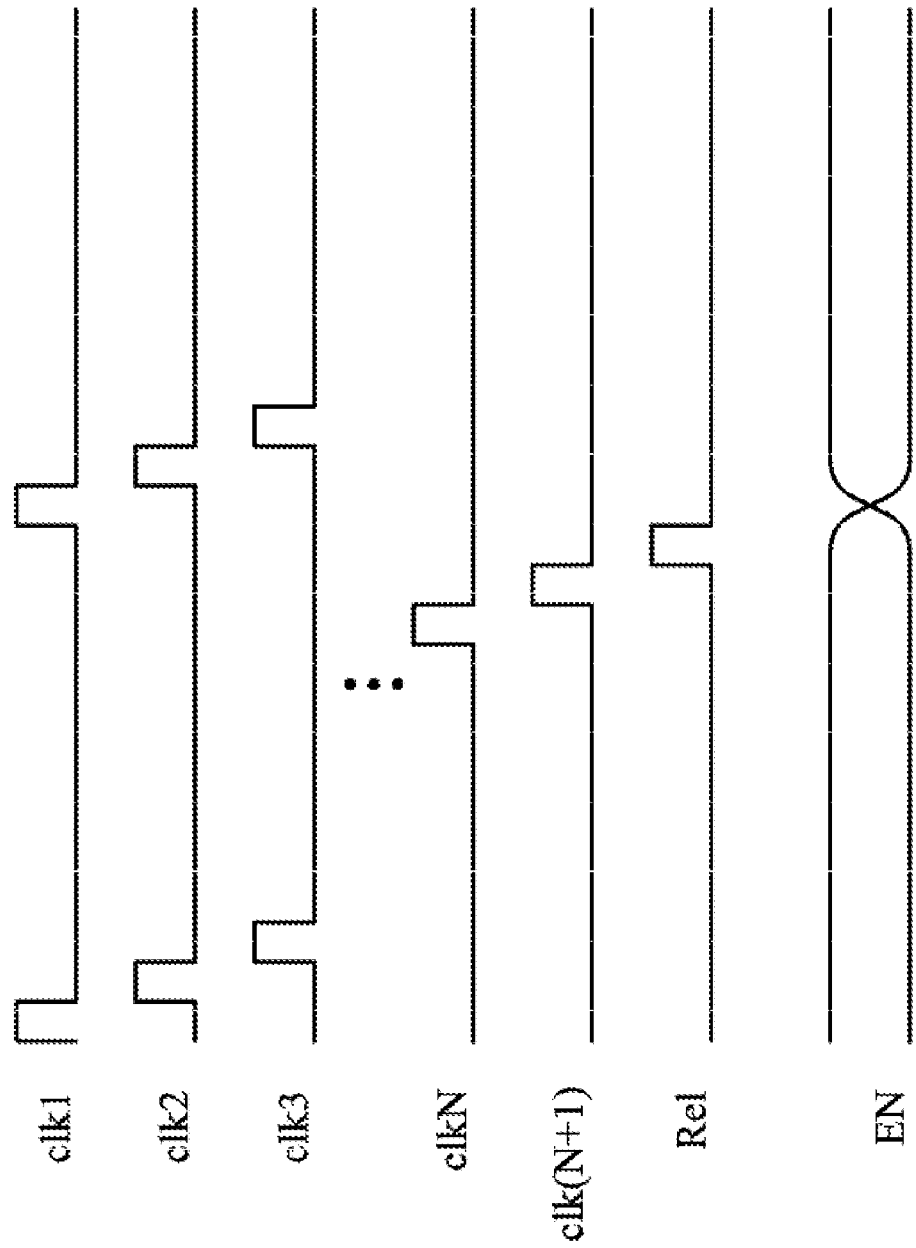
FIG. 2B depicts the timing diagram of the control signals of the switched capacitor network 200.

FIG. 2A depicts an exemplary embodiment of the single-in-single-out switched capacitor networks (labeled 200) and FIG. 2B depicts the timing diagram of the control signals of the switched capacitor network 200. According to the control signals clk1 ... clkN, the switches S1 ... SN are turned on alternatively to allow the input signal IN to charge up the capacitors C1 ... CN. Thereafter, the control signal clk(N+1) turns on all of the switches SS1 ... SSN to allow the electrons stored in the capacitors C1 ... CN to be shared by the capacitor Co. The control signal Re1 is operative to turn on the switches RS1 ... RSN to reset the capacitors C1 ... CN.

The switches ENS1 and RS(N+1) are designed for extending the bandwidth of the filter. The control signal EN controls the status of the switch ENS1. When the switch ENS1 is disabled (turned off), the electrons of the capacitor Co cannot be reset so that the switched capacitor network 200 is an infinite impulse response (IIR) filter and provides a narrow bandwidth. When the switch ENS1 is enabled (turned on), the capacitor Co can be reset via the current path using the turned-on switches RS(N+1) and ENS1 so that the switched capacitor network 200 is a finite impulse response (FIR) filter and provides a wide bandwidth. The switch ENS2 and the capacitor Ca determine an efficient capacitor Ceff which affects the bandwidth of the switched capacitor network. The total capacitance (Co+Ceff(Ca, Va)) at the output terminal OUT is dependent on the signal Va.

Figure 3A:
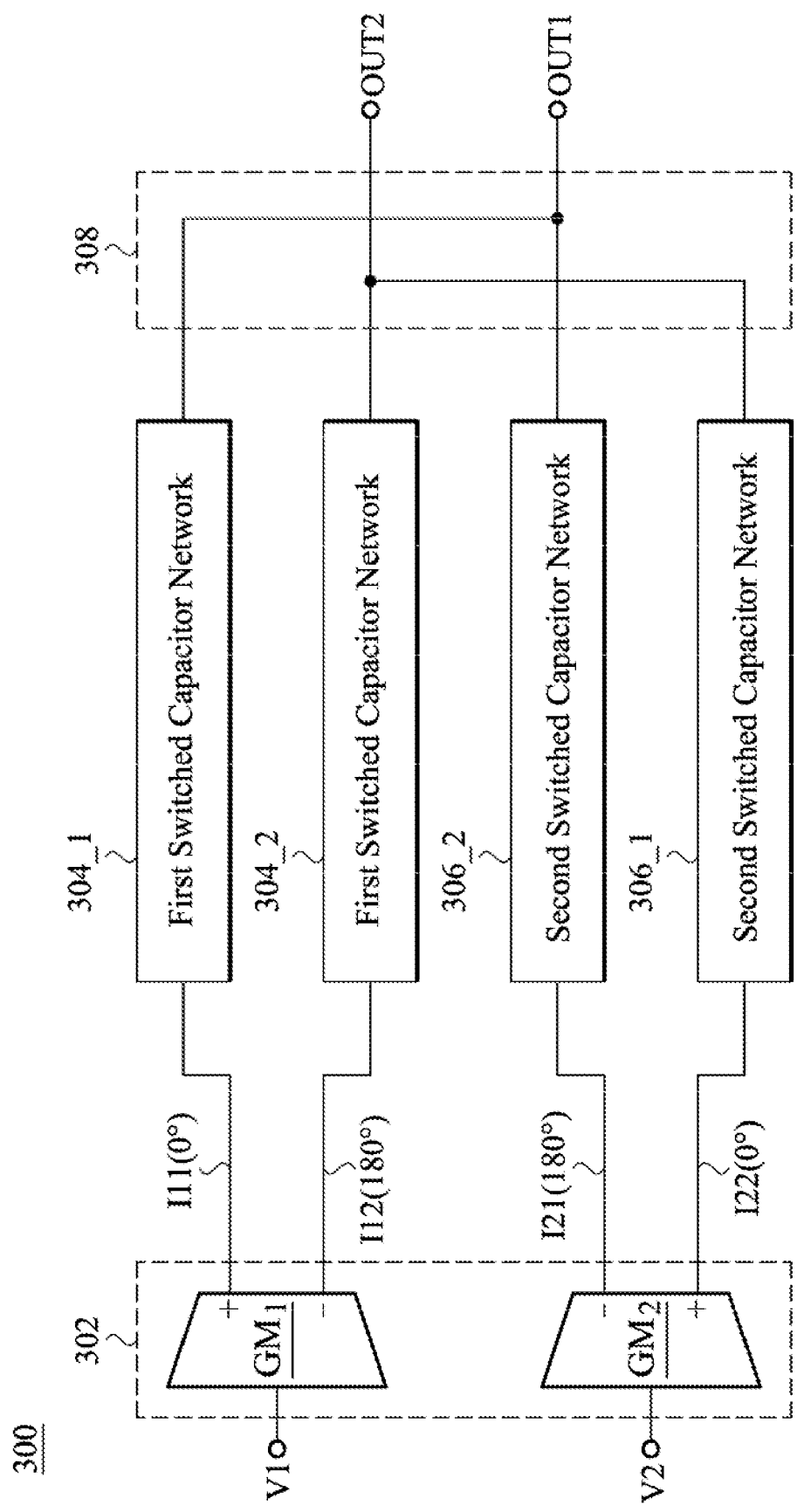
FIG. 3A depicts another exemplary embodiment of the switched capacitor network.

FIG. 3A depicts another exemplary embodiment of the switched capacitor network. The switched capacitor network 300 comprises a phase divider 302, first switched capacitor networks 304_1 and 304_2, second switched capacitor networks 306_1 and 306_2 and a connecting circuit 308. The phase divider 302 comprises two transconductance devices GM1 and GM2. The transconductance device GM1 receives a first input signal V1 (voltage type) and transforms the first input signal V1 to current type signals: a first in-phase signal I11 (in phase with the first input signal V1) and a first inverse phase signal I12 (having an inverse phase in comparison with the first input signal V1). The transconductance device GM2 receives the second input signal V2 (voltage type) and transforms the second input signal V2 to current type signals: a second in-phase signal I22 (in phase with the second input signal V2); and a second inverse phase signal I21 (having an inverse phase in comparison with the second input signal V2). The connecting circuit 308 connects the output terminal of the first switched capacitor network 304_1 (which receives the first in-phase signal I11) to the output terminal of the second switched capacitor network 306_2 (which receives the second inverse phase signal I21), to generate an output signal OUT1. Furthermore, the connecting circuit 308 connects the output terminal of the first switched capacitor network 304_2 (which receives the first inverse phase signal I12) to the output terminal of the second switched capacitor network 306_1 (which receives the second in-phase signal I22), to generate an output signal OUT2. By designing the structures of the first switched capacitor networks 304_1 and 304_2 and the second switched capacitor networks 306_1 and 306_2, the charge domain filter 300 can filter the signals in the stop band as well as filter the common-mode noise in the in-band frequency. The signal mismatch can be improved and the even order noise can be reduced.

Figure 3B:
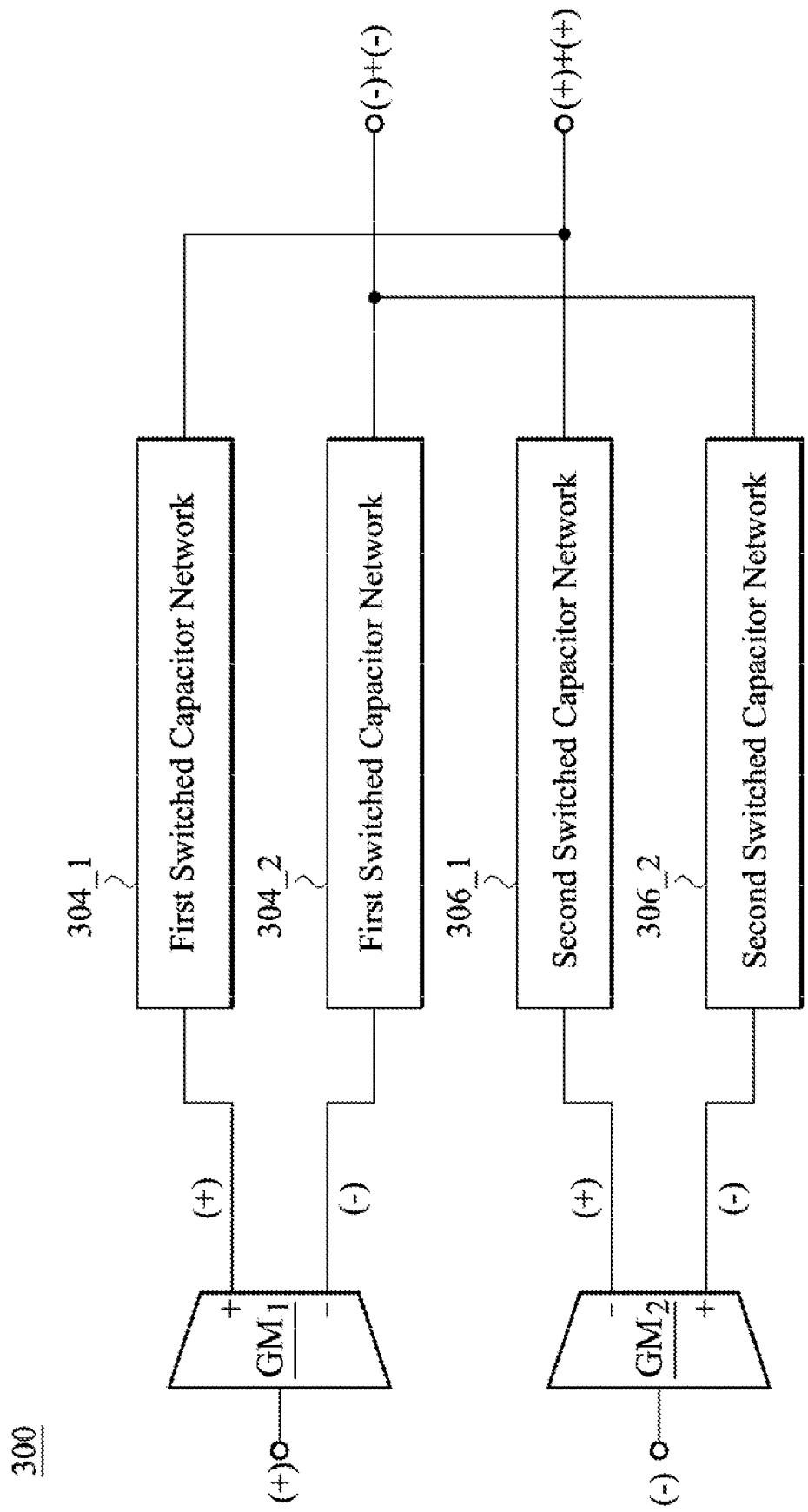
FIG. 3B shows signal phase by symbols (+) and (−), in which the input signals are of inverse phase.
Figure 3C:
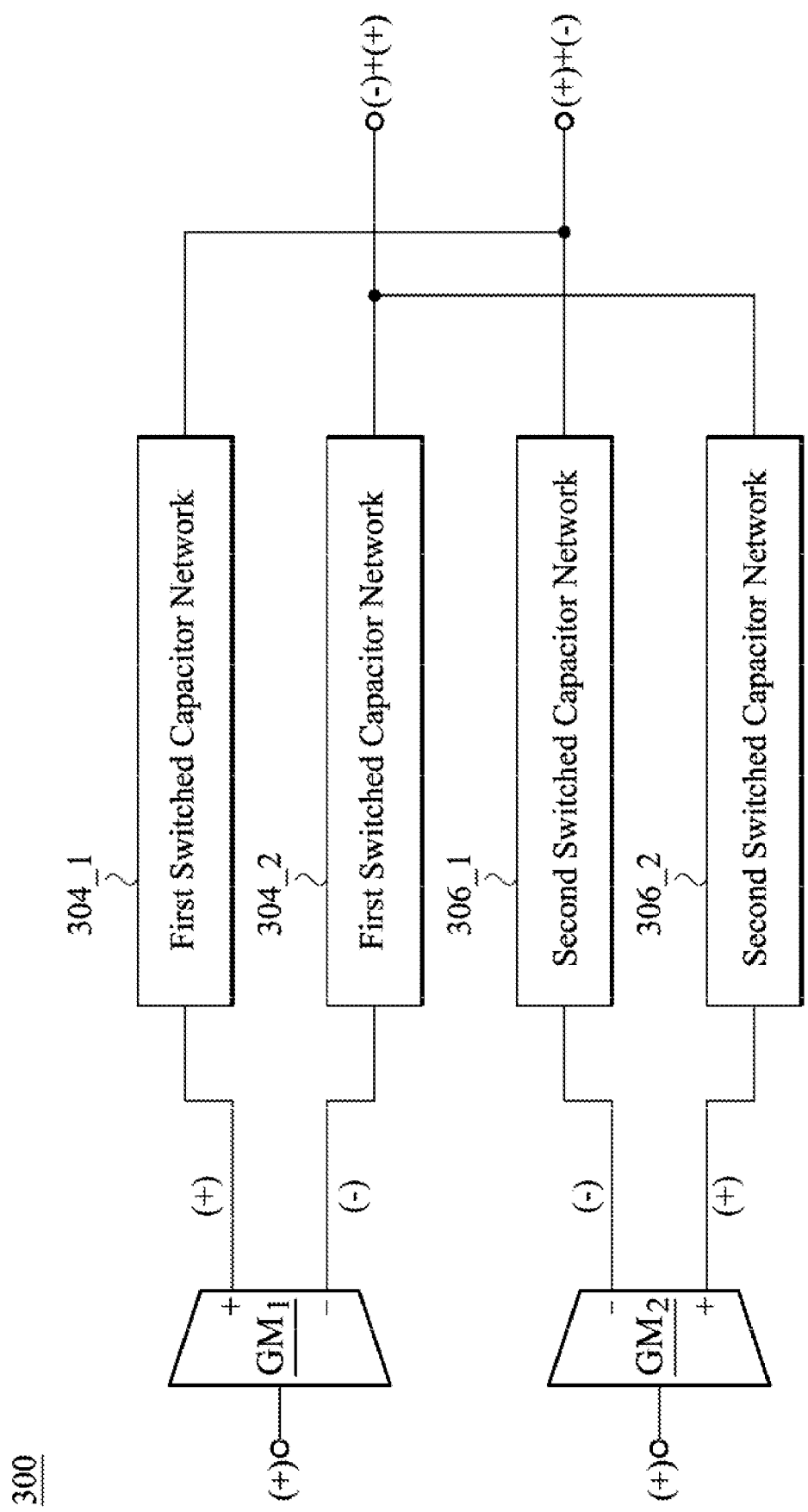
FIG. 3C shows signal phase by symbols (+) and (−), in which the input signals are in phase.

This paragraph discusses the improvements provided by the charge domain filter 300. An in-phase signal and an inverse phase signal, which are provided by a receiver, maybe input to the charge domain filter 300 as the first input signal V1 and the second input signal V2. However, the signals transmitted by V1 and V2 may be non-ideal and may include common-mode noises. For example, the actual signal working as the first input signal V1 may include an in-phase data signal (symbolized by '+V') and an in-phase common mode noise (symbolized by '+N'), and the actual signal working as the second input signal V2 may include an inverse phase data signal (labeled by '−V') and the in-phase common mode noise +N; this means that the data signal (V) contained in the signals V1 and V2 are of inverse phase and the common mode noise (N) contained in the signals V1 and V2 are in phase. FIG. 3B shows the signal phase by symbols (+) and (−), wherein the input signals have inverse phase. FIG. 3C shows a case wherein the input signals are in phase.

Referring to FIG. 3B, the inverse phase inputs (+) and (−) result in enhanced output signals (labeled by (+)+(+) and (−)+(−)). Referring to FIG. 3C, it shows that in-phase inputs result in reduced outputs, labeled by (−)+(+) and (+)+(−). The filter 300 makes a considerable in-band common mode noise filtering.

This paragraph further details the application of the charge domain filter 300. The first and second switched capacitor networks of the charge domain filter 300 may use the same clock signal and may be realized by using the techniques in FIGS. 2A and 2B. To distinguish the first and second switched capacitor networks, the capacitor parameters are tagged with 'p' for the first switched capacitor networks (for example, networks 304_1 and 304_2), and are tagged with 'n' for the capacitor parameters of the second switched capacitor network (for example, networks 306_1 and 306_2).

For the inverse phase signals in the inputs V1 and V2, such as the in-phase and inverse phase data signals ('+V' and '−V'), the transfer function may be:

$$H_{STF,IIR}(z) = \frac{\left(\dfrac{\sum_{i=1}^{P} Cp_{P+1-i}z^{-(i-1)}}{Cop + \sum_{i=1}^{P} Cp_i}\right)}{\left(1 - \dfrac{Cop \cdot z^{-(P+1)}}{Cop + \sum_{i=1}^{P} Cp_i}\right)} + \frac{\left(\dfrac{\sum_{i=1}^{N} Cn_{N+1-i}z^{-(i-1)}}{Con + \sum_{i=1}^{N} Cn_i}\right)}{\left(1 - \dfrac{Con \cdot z^{-(N+1)}}{Con + \sum_{i=0}^{N} Cn_i}\right)},$$

for *IIR* filter, or $$H_{STF,FIR}(z) = \left(\frac{\sum_{i=1}^{P} Cp_{P+1-i}z^{-(i-1)}}{Cop + \sum_{i=1}^{P} Cp_i}\right) + \left(\frac{\sum_{i=1}^{N} Cn_{N+1-i}z^{-(i-1)}}{Con + \sum_{i=1}^{N} Cn_i}\right),$$

for *FIR* filter.

For the in-phase signals in the inputs V1 and V2, such as the common mode noise (+N of both inputs V1 and V2), the transfer function may be:

$$H_{NTF,IIR}(z) = \frac{\left(\dfrac{\sum_{i=1}^{P} Cp_{P+1-i}z^{-(i-1)}}{Cop + \sum_{i=1}^{P} Cp_i}\right)}{\left(1 - \dfrac{Cop \cdot z^{-(P+1)}}{Cop + \sum_{i=1}^{P} Cp_i}\right)} - \frac{\left(\dfrac{\sum_{i=1}^{N} Cn_{N+1-i}z^{-(i-1)}}{Con + \sum_{i=1}^{N} Cn_i}\right)}{\left(1 - \dfrac{Con \cdot z^{-(N+1)}}{Con + \sum_{i=0}^{N} Cn_i}\right)},$$

for *IIR* filter, or $$H_{NTF,FIR}(z) = \left(\frac{\sum_{i=1}^{P} Cp_{P+1-i}z^{-(i-1)}}{Cop + \sum_{i=1}^{P} Cp_i}\right) - \left(\frac{\sum_{i=1}^{N} Cn_{N+1-i}z^{-(i-1)}}{Con + \sum_{i=1}^{N} Cn_i}\right),$$

for *FIR* filter.

Figure 4B:
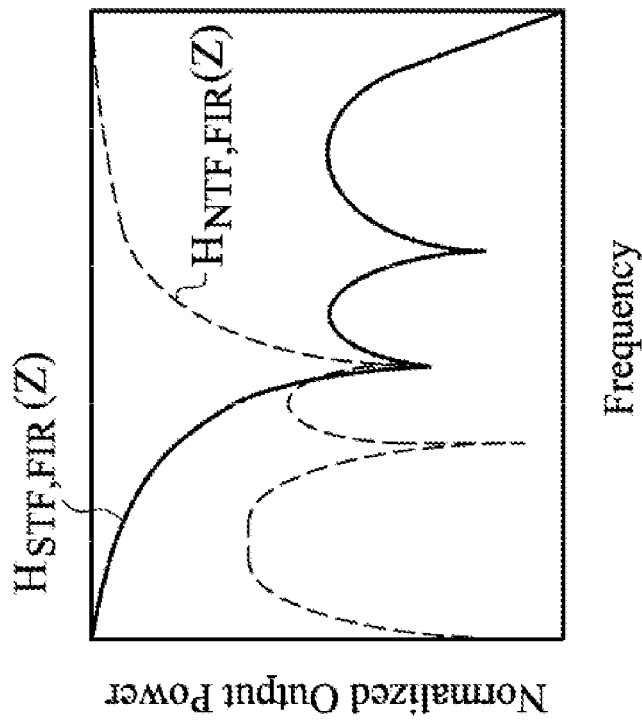
Figure 4A:
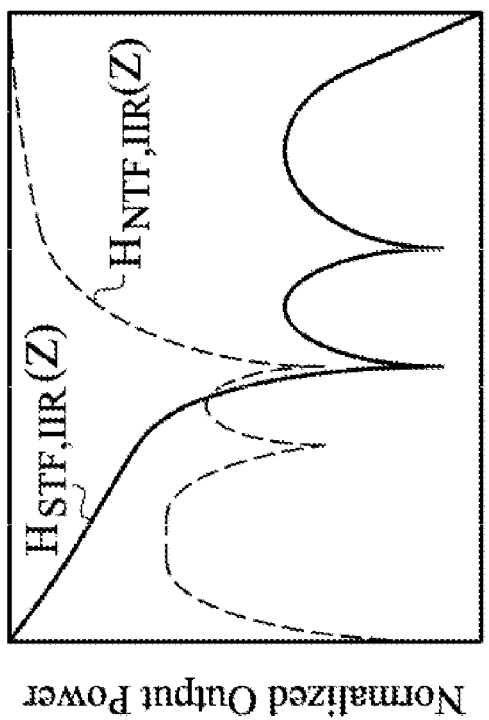

FIG. 4A depicts the frequency response of the narrow band BR filter ($H_{STF,IIR}(z)$ and $H_{NTF,IIR}(z)$). The frequency response $H_{STF,IIR}(z)$ allows the data signal within the in-band frequency to be maintained after the filter process while the frequency response $H_{NTF,IIR}(z)$ effectively filters the common mode noise within the in-band frequency.

FIG. 4B depicts the frequency response of the wide band FIR filter ($H_{STF,FIR}(z)$ and $H_{NTF,FIR}(z)$). The frequency response $H_{STF,FIR}(z)$ allows the data signal within the in-band frequency to be maintained after the filter process while the frequency response $H_{NTF,FIR}(z)$ effectively filters the common mode noise within the in-band frequency. In comparison with the frequency response $H_{STF,IIR}(z)$ of FIG. 4A, the frequency response $H_{STF,FIR}(z)$ has a wider bandwidth.

Figure 4C:
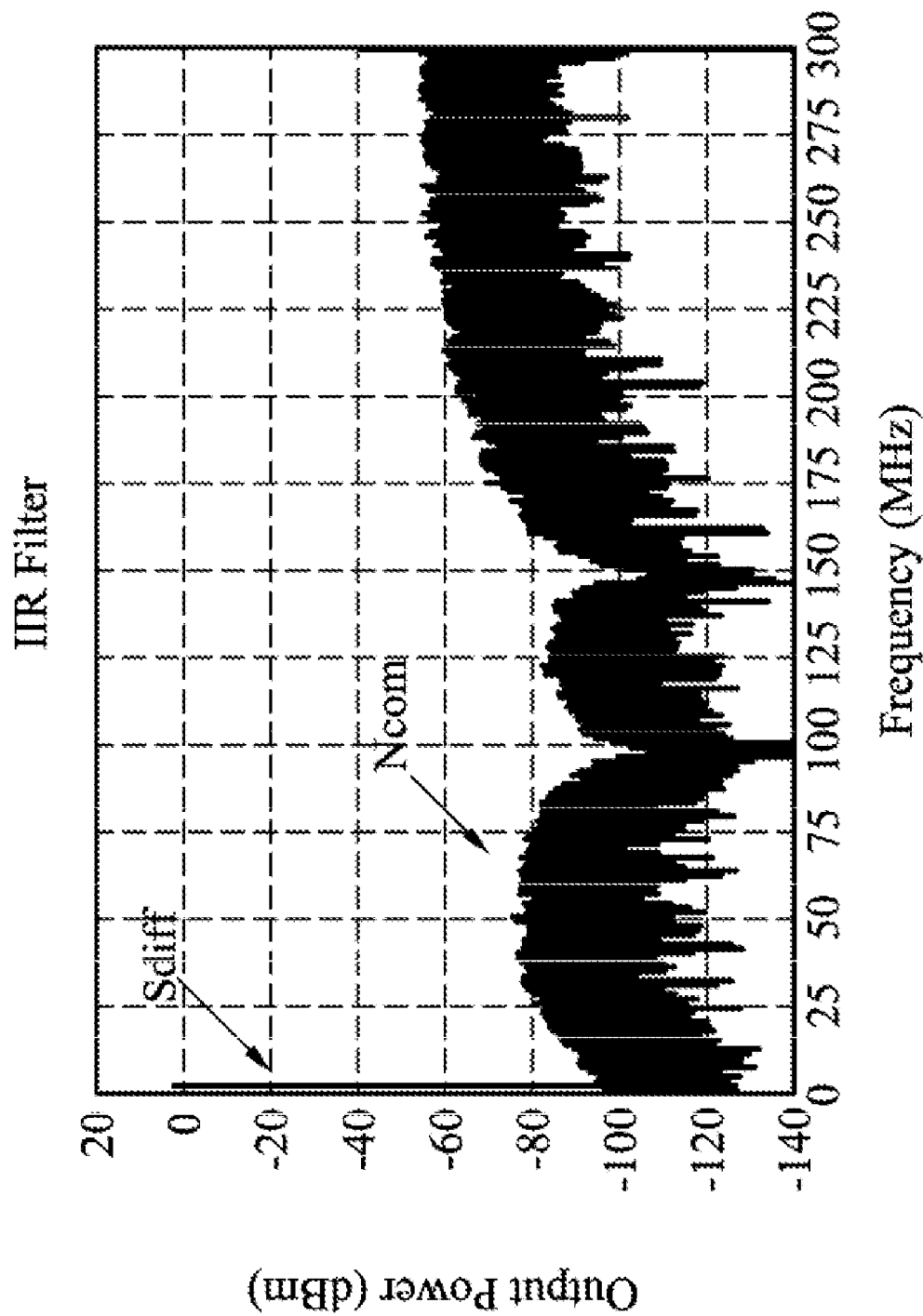
FIG. 4C shows the filtered signals of the IIR filter.
Figure 4D:
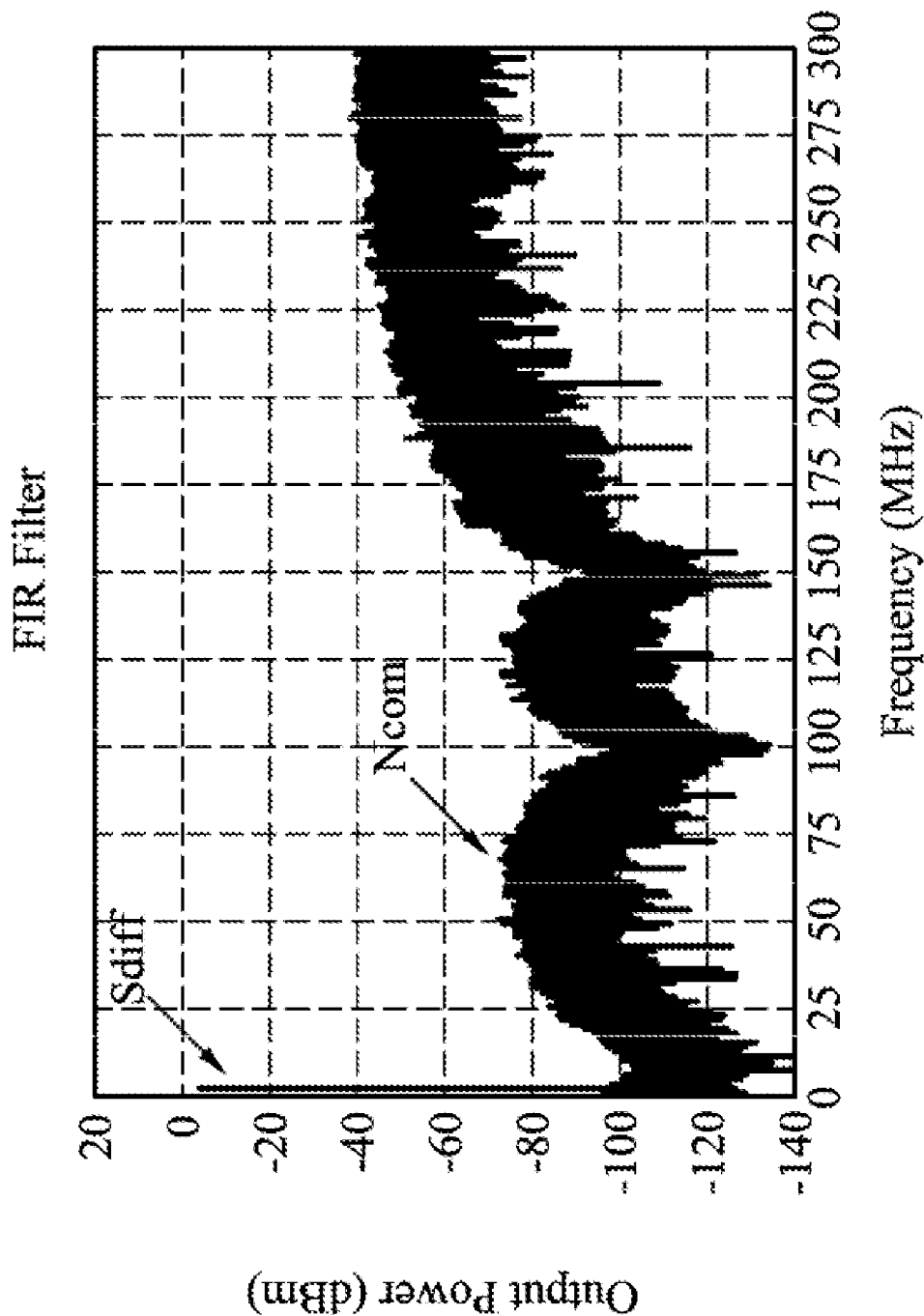
FIG. 4D shows the filtered signals of the FIR filter.

FIGS. 4C and 4D show the filtered signals of the IIR filter and the FIR filter, wherein the test inputs of the charge domain filter 300 include a differential portion at a specific frequency (such as 2 MHz) within the in-band frequency and a common mode portion through a wide band (such as range 0~300 MHz). FIGS. 4C and 4D show that the response of the differential portion is good and the pulse Sdiff shows that the differential portion is almost completely maintained in the filtered signal. As for the common mode portion, the figures show that it is effectively suppressed within the in-band frequency (as shown by Ncom).

In addition to suppressing the common mode noise within the in-band frequency, the frequency response $H_{NTF,IIR}(z)$ and $H_{NTF,FIR}(z)$ for in-phase inputs can suppress the even order harmonics and solve the mismatch problem. Furthermore, the non-ideal signals which are in-phase in the input signals V1 and V2 can be suppressed by the charge domain filter 300.

Figure 5A:
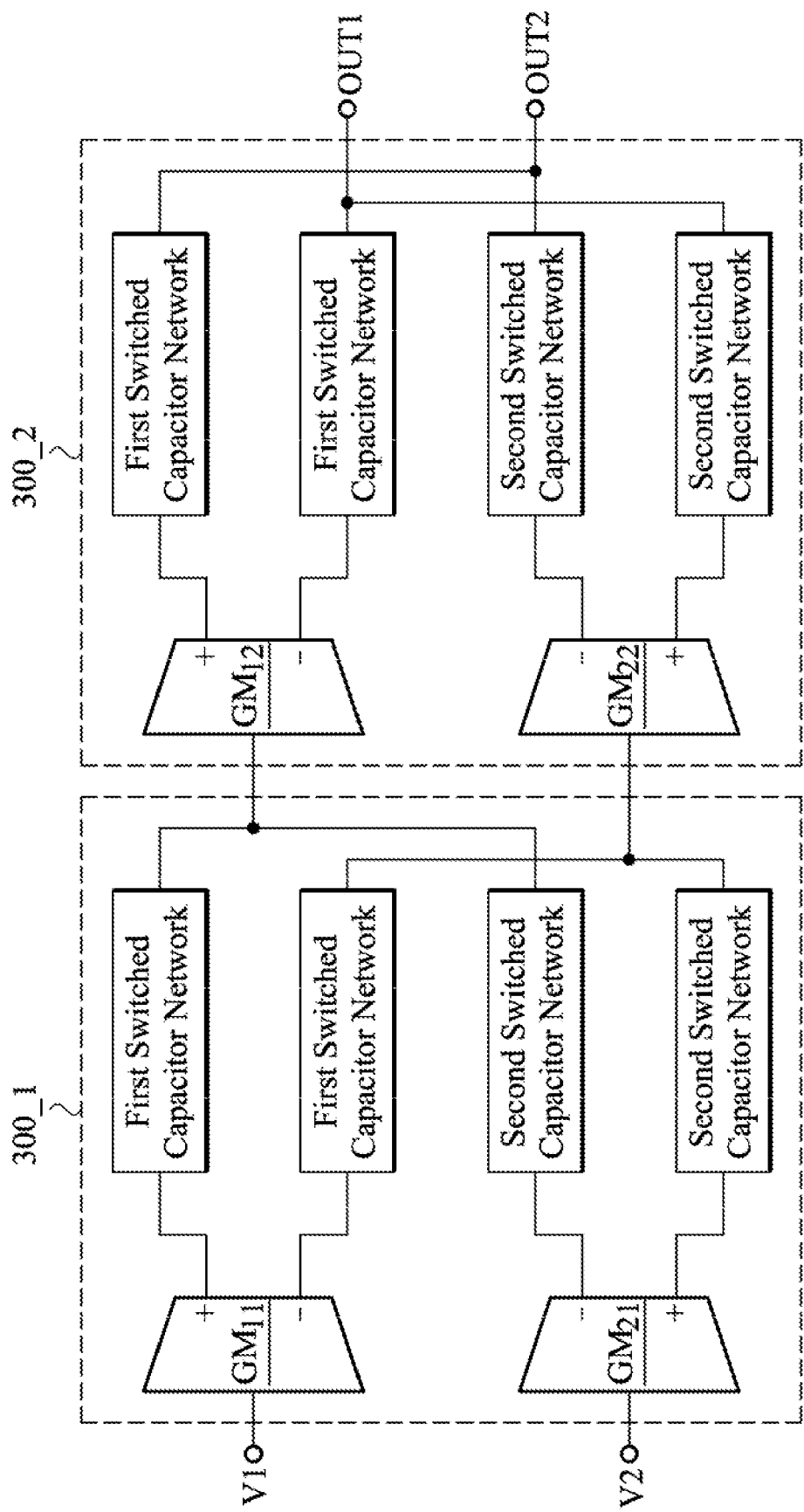
FIG. 5A depicts a filter, in which are two cascaded charge domain filters.
Figure 5B:
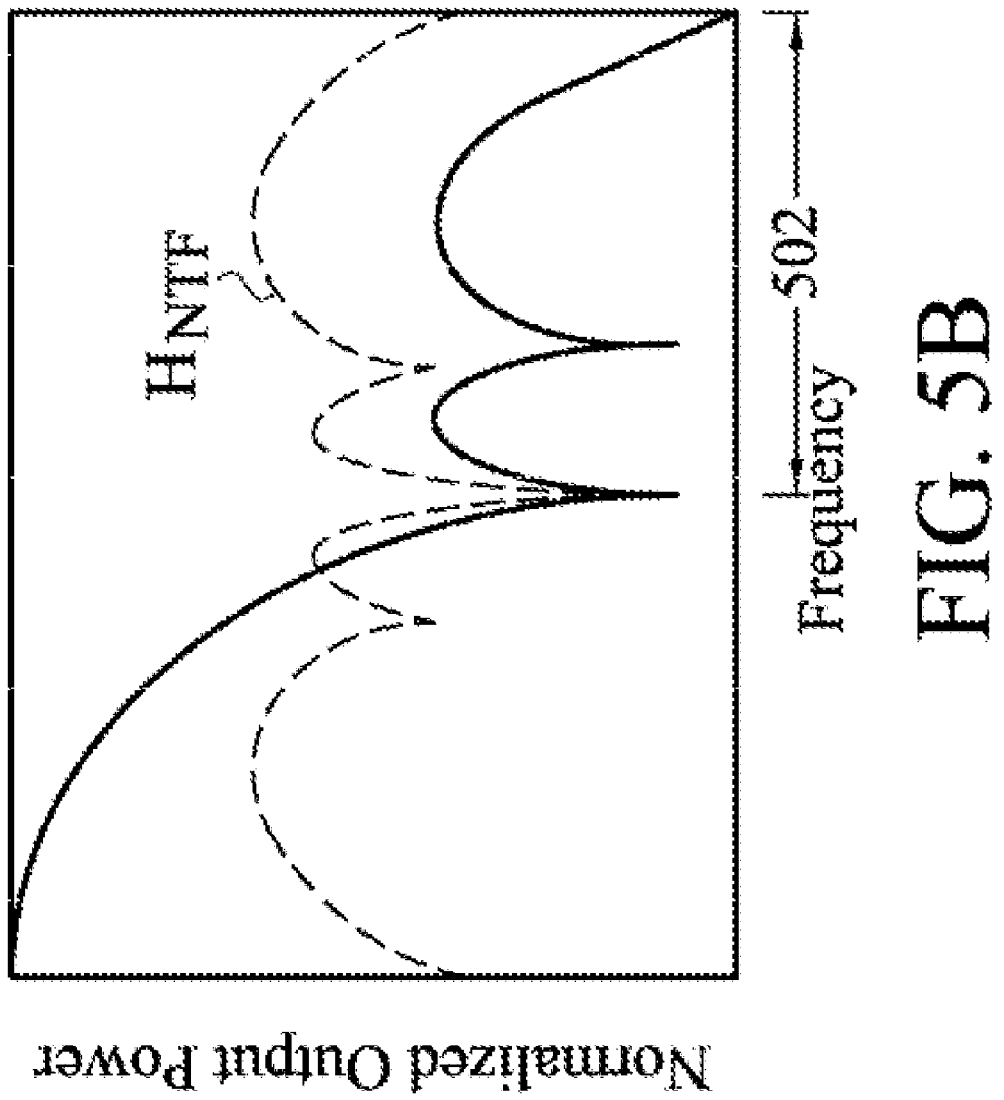
FIG. 5B shows the frequency response of the filter of FIG. 5A.

Referring back to FIGS. 4A and 4B, the frequency response $H_{NTF,IIR}(z)$ and $H_{NTF,FIR}(z)$ is weak in filtering the common mode noise in the stop band. The specification further discloses a structure of cascaded charge domain filters to solve the problem. FIG. 5A depicts a filter, in which includes two cascaded charge domain filters 300_1 (including transconductance devices GM11 and GM21) and 300_2 (including transconductance devices GM12 and GM22). The outputs of the first stage charge domain filter 300_1 are inputted to the second stage charge domain filter 300_2. The solid line of FIG. 5B shows the frequency response of the filter of FIG. 5A. Compared to the frequency response $H_{NTF}$ provided by a one stage charge domain filter, the filter of FIG. 5A effectively suppress the common mode noise in the stop band 502. In other embodiments, the cascaded stages 300_1 and 300_2 may be realized by distinct structures rather than by identical charge domain filters.

Figure 6:
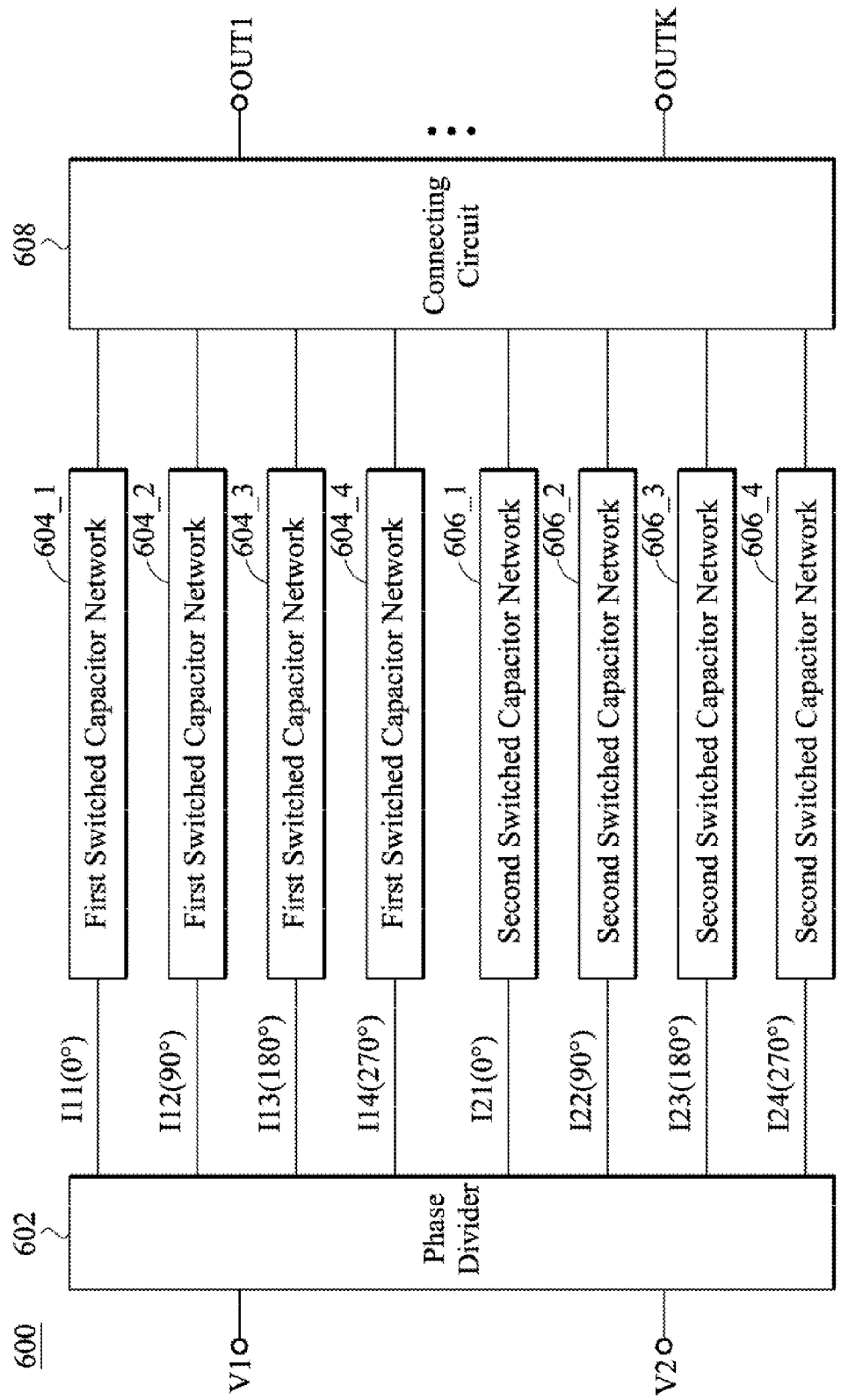
FIG. 6 depicts another exemplary embodiment of the charge domain filter, wherein the phase divider 602 may be realized by mixers.

FIG. 6 depicts another exemplary embodiment of the charge domain filter, wherein the phase divider 602 may be realized by mixers. The phase divider 602 divides the first input signal V1 into four phases (first phase divided signals I11, I12, I13 and I14) and divides the second input signal V2 into four phases (second phase divided signals I21, I22, I23 and I24). In comparison with the first input signal V1, the first phase divided signals I11, I12, I13 and I14 provide 0°, 90°, 180° and 270° phase differences, respectively. In comparison with the second input signal V2, the second phase divided signals I21, I22, I23 and I24 provide 0°, 90°, 180° and 270° phase differences, respectively. The first phase divided signals I11 . . . I14 are received by the first switched capacitor networks 604_1 . . . 604_4, respectively. The second phase divided signals I21 . . . I24 are received by the second switched capacitor networks 606_1 . . . 606_4, respectively. The connecting circuit 608 determines the connections between the output terminals of the first and second switched capacitor networks 604_1 . . . 604_4 and 606_1 . . . 606_4 to generate output signals OUT1 . . . OUTK.

In comparison with the phase divider 302 which only generates signals with 0° and 180° phase differences, the phase divider 602 generating signals with 0°, 90°, 180° and 270° phase differences and further improves the image rejection of the charge domain filter.

Figure 7:
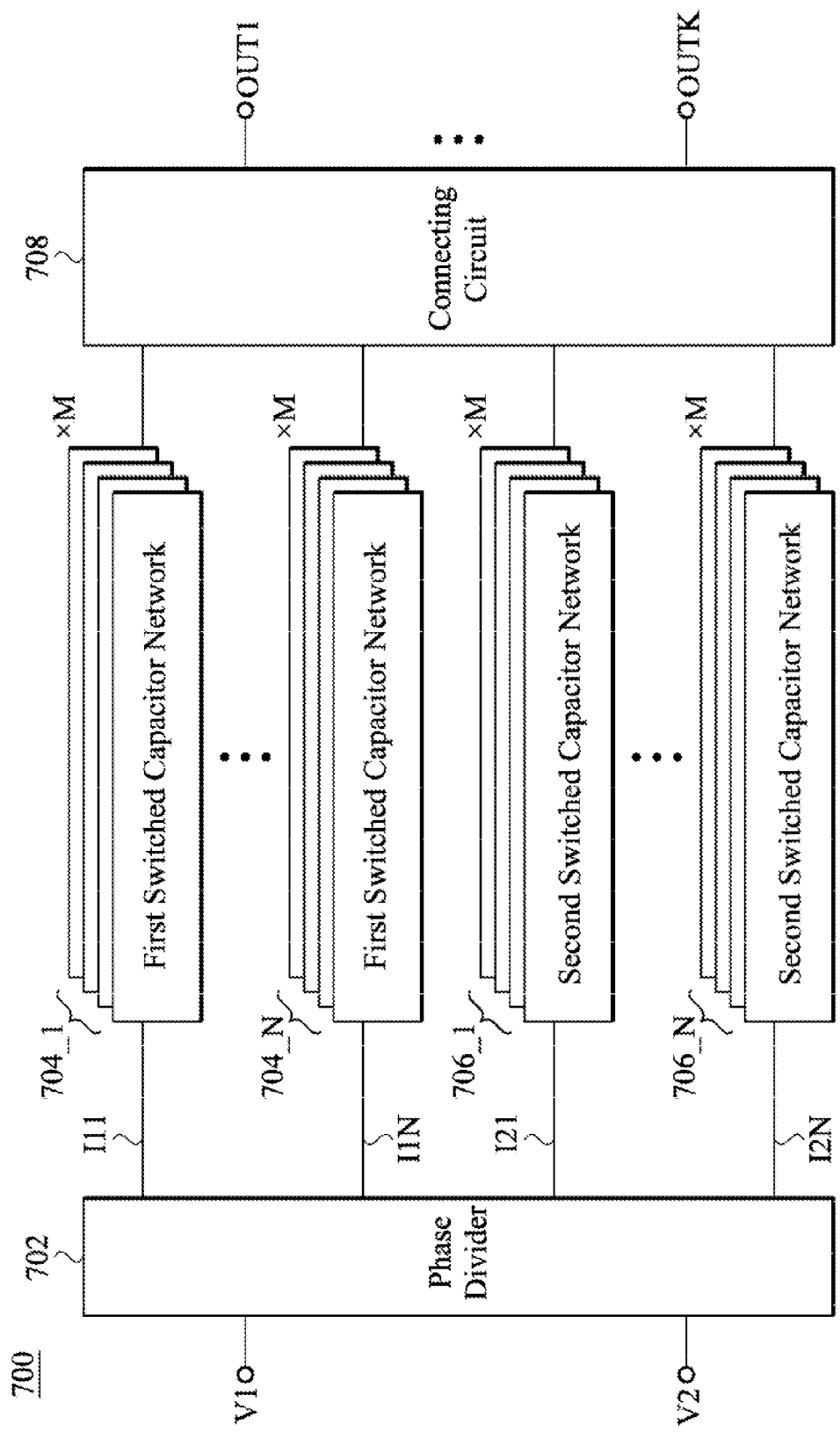
FIG. 7 depicts another exemplary embodiment of the charge domain filter, which involves a time-interleaving technique.

FIG. 7 depicts another exemplary embodiment of the charge domain filter which involves a time-interleaving technique. As shown, each of the first and second phase divided signals I11 . . . I1N and I21 . . . I2N is not only sent to a single switched capacitor network. Instead, each of the first and second phase divided signals I11 . . . I1N and I21 . . . I2N relates to a group of switched capacitor networks and is sent to the corresponding networks at different times. For example, the first phase divided signal I11 is received by the M networks of group 704_1 alternatively, and the output terminals of the M networks of group 704_1 are connected to each other. As for the first phase divided signal I1N, it is received by the M networks of group 704_N alternatively, and the output terminals of the M networks of group 704_N are connected to each other. Furthermore, the second phase divided signal I21 is received by the M networks of group 706_1 alternatively, and the output terminals of the M networks of group 706_1 are connected to each other. As for the second phase divided signal I2N, it is received by the M networks of group 706_N alternatively, and the output terminals of the M networks of group 706_N are connected to each other. The connecting circuit 708 is designed to determine connections between the outputs of the groups of switched capacitor networks (including groups 704_1 . . . 704_n and 706_1 . . . 706_N) and thereby generates output signals OUT1 . . . OUTK.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A charge domain filter, comprising:
   a phase divider, receiving a first input signal and a second input signal, to generate a plurality of first phase divided signals according to the first input signal and to generate a plurality of second phase divided signals according to the second input signal;
   a plurality of first switched capacitor networks, holding a one to one relationship with the first phase divided signals, wherein each of the first switched capacitor network has an input terminal receiving the corresponding first phase divided signal and has an output terminal;
   a plurality of second switched capacitor networks, holding a one to one relationship with the second phase divided signals, wherein each of the second switched capacitor network has an input terminal receiving the corresponding second phase divided signal and has an output terminal;
   a connecting circuit, forming connections between the output terminals of the first and second switched capacitor networks to generate a plurality of output signals.

2. The charge domain filter as claimed in claim 1, wherein the first phase divided signals include a first in-phase signal and a first inverse phase signal, and the second phase divided signals include a second in-phase signal and a second inverse phase signal.

3. The charge domain filter as claimed in claim 2, wherein the connecting circuit couples the output terminal of the first switched capacitor network corresponding to the first in-phase signal to the output terminal of the second switched capacitor network corresponding to the second inverse phase signal, and couples the output terminal of the first switched capacitor network corresponding to the first inverse phase signal to the output terminal of the second switched capacitor network corresponding to the second in-phase signal.

4. The charge domain filter as claimed in claim 1, wherein the first phase divided signals include signals with 0°, 90°, 180° and 270° phase differences in comparison with the first input signal, and the second phase divided signals include signals with 0°, 90°, 180° and 270° phase differences in comparison with the second input signal.

5. The charge domain filter as claimed in claim 4, wherein the connecting circuit comprises four nodes and forms connections between the output terminals of the first and second switched capacitor networks and the four nodes, and uses the four nodes to provide the output signals.

6. The charge domain filter as claimed in claim 1, wherein the connecting circuit includes traces or at least one electronic component or a circuit, to indirectly or directly connect the output terminals of the first and second switched capacitor networks for generation of the output signals.

7. A device for a signal filter, comprises:
   a plurality of charge domain filters cascaded in a series, wherein each of the charge domain filters comprises:
   a phase divider, receiving a first input signal and a second input signal to generate a plurality of first phase divided signals based on the first input signal and a plurality second phase divided signals based on the second input signal;
   a plurality of first switched capacitor networks, holding a one to one relationship with the first phase divided signals, wherein each of the first switched capacitor networks comprises an input terminal receiving the corresponding first phase divided signal and an output terminal;
   a plurality of second switched capacitor networks, holding a one to one relationship with the second phase divided signals, wherein each of the second switched capacitor networks comprises an input terminal receiving the corresponding second phase divided signal and an output terminal;
   a connecting circuit, forming connections between the output terminals of the first and second switched capacitor networks to generate at least two output signals to be input to circuit of the next stage.

8. The device as claimed in claim 7, wherein, in each of the charge domain filters, the first phase divided signals include a first in-phase signal and a first inverse phase signal, and the second phase divided signals include a second in-phase signal and a second inverse phase signal.

9. The device as claimed in claim 8, wherein, in each charge domain filter, the connecting circuit couples the output terminal of the first switched capacitor network corresponding to the first in-phase signal to the output terminal of the second switched capacitor network corresponding to the second inverse phase signal, and couples the output terminal of the first switched capacitor network corresponding to the first inverse phase signal to the output terminal of the second switched capacitor network corresponding to the second in-phase signal.

10. The device as claimed in claim 7, wherein, in each of the charge domain filters, the connecting circuit comprises traces or at least one electronic component or a circuit, to indirectly or directly connect the output terminals of the first and second switched capacitor networks for generation of the output signals.

11. A charge domain filter, comprising:
- a phase divider, receiving a first input signal and a second input signal to generate a plurality of first phase divided signals based on the first input signal and to generate a plurality of second phase divided signals based on the second input signal;
- groups of first switched capacitor networks, wherein different groups relate to different ones of the first phase divided signals, and each of the first switched capacitor networks has an input signal receiving the corresponding first phase divided signal and has an output terminal;
- groups of second switched capacitor networks, wherein different groups relate to different ones of the second phase divided signals, and each of the second switched capacitor networks has an input terminal receiving the second phase divided signal and has an output terminal; and
- a connecting circuit, forming connections between the output terminals of the first and second switched capacitor networks to generate a plurality of output signals.

12. The charge domain filter as claimed in claim 11, wherein, in each group formed by first switched capacitor networks, the output terminals of the first switched capacitor networks contained therein are connected to each other, and, in each group formed by second switched capacitor networks, the output terminals of the second switched capacitor networks contained therein are connected to each other.

13. The charge domain filter as claimed in claim 12, wherein the first phase divided signals include a first in-phase signal and a first inverse phase signal, and the second phase divided signals include a second in-phase signal and a second inverse phase signal.

14. The charge domain filter as claimed in claim 13, wherein the connecting circuit connects the output terminals of the first switched capacitor networks receiving the first in-phase signal to the output terminals of the second switched capacitor networks receiving the second inverse phase signal, and connects the output terminals of the first switched capacitor networks receiving the first inverse phase signal to the output terminals of the second switched capacitor networks receiving the second in-phase signal.

15. The charge domain filter as claimed in claim 11, wherein the connecting circuit comprises traces or at least one electronic device or circuit, to indirectly or directly connect the output terminals of the first and second switched capacitor networks for generation of the output signals.

* * * * *